(12) United States Patent
Van Setten et al.

(10) Patent No.: US 9,798,225 B2
(45) Date of Patent: Oct. 24, 2017

(54) METHOD OF CHARACTERIZING, METHOD OF FORMING A MODEL, METHOD OF SIMULATING, MASK MANUFACTURING METHOD AND DEVICE MANUFACTURING METHOD

(71) Applicant: ASML Netherlands B.V., Veldhoven (NL)

(72) Inventors: Eelco Van Setten, Eindhoven (NL); Natalia Viktorovna Davydova, Eindhoven (NL); Eleni Psara, Eindhoven (NL); Anton Bernhard Van Oosten, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/034,105

(22) PCT Filed: Oct. 14, 2014

(86) PCT No.: PCT/EP2014/072035
§ 371 (c)(1),
(2) Date: May 3, 2016

(87) PCT Pub. No.: WO2015/067443
PCT Pub. Date: May 14, 2015

(65) Prior Publication Data
US 2016/0266483 A1    Sep. 15, 2016

(30) Foreign Application Priority Data
Nov. 5, 2013    (EP) .................................... 13191593

(51) Int. Cl.
*G03F 1/22* (2012.01)
*G03F 1/24* (2012.01)
*G03F 1/38* (2012.01)
*G03F 1/44* (2012.01)
*G03F 1/68* (2012.01)
*G03F 1/70* (2012.01)
*G03F 7/20* (2006.01)

(52) U.S. Cl.
CPC .................. *G03F 1/24* (2013.01); *G03F 1/22* (2013.01); *G03F 1/38* (2013.01); *G03F 1/44* (2013.01); *G03F 1/68* (2013.01); *G03F 1/70* (2013.01); *G03F 7/2004* (2013.01); *G03F 7/70433* (2013.01); *G03F 7/70616* (2013.01); *G03F 7/70625* (2013.01); *G03F 7/70683* (2013.01)

(58) Field of Classification Search
CPC ..... G03F 1/22; G03F 1/24; G03F 1/38; G03F 1/44; G03F 1/68; G03F 1/70; G03F 7/2004; G03F 7/70433; G03F 7/70616; G03F 7/70625; G03F 7/70683
USPC ............................................... 430/5, 30, 394
See application file for complete search history.

(56) References Cited

U.S. PATENT DOCUMENTS

| 4,645,338 | A | 2/1987 | Juliana, Jr. et al. |
| 5,439,764 | A | 8/1995 | Alter et al. |
| 8,153,335 | B2 | 4/2012 | Schroeder |
| 2007/0154817 | A1 | 7/2007 | Leunissen et al. |
| 2011/0151357 | A1 | 6/2011 | Nakajima et al. |
| 2014/0118712 | A1 | 5/2014 | Goeppert et al. |

FOREIGN PATENT DOCUMENTS

| CN | 103454860 | 12/2013 |
| EP | 1 795 967 | 6/2007 |
| EP | 1 962 138 | 8/2008 |
| JP | 2003-318089 | 11/2003 |
| JP | 2007-206333 | 8/2007 |

OTHER PUBLICATIONS

International Search Report and Written Opinion mailed Jan. 26, 2015 in corresponding International Patent Application No. PCT/EP2014/072035.
Natalia Davydova et al., "Experimental Approach to EUV Imaging Enhancement by Mask Absorber Height Optimization," Proc. of SPIE, vol. 8886, pp. 88860A-1-88860A-15 (Oct. 1, 2013).
Julien Mailfert et al., "3D Mask Modeling for EUV Lithography," Proc. of SPIE, vol. 8322, pp, 832224-1-832224-11 (Mar. 23, 2012).
Hua Song et al., "Shadowing effect modeling and compensation for EUV lithography," Proc. of SPIE, vol. 7969, pp. 79691O-1-79691O-9 (2011).
Yoonsuk Hyun et al., "Feasibility of EUVL thin absorber mask for minimization of mask shadowing effect," Proc. of SPIE, vol. 7636, pp. 763614-1-763614-11 (2010).

*Primary Examiner* — Christopher Young
(74) *Attorney, Agent, or Firm* — Pillsbury Winthrop Shaw Pittman LLP

(57) ABSTRACT

A method of characterizing a lithographic mask type uses a mask having thereon test pattern units of linear features at different orientations. The mask is exposed, rotated by angle, exposed again, rotated by a further angle, exposed, etc. The printed features are measured to determine one or more characteristics of the mask. The method can be used to model shadowing effects of a EUV mask with a thick absorber illuminated at an angle.

20 Claims, 10 Drawing Sheets

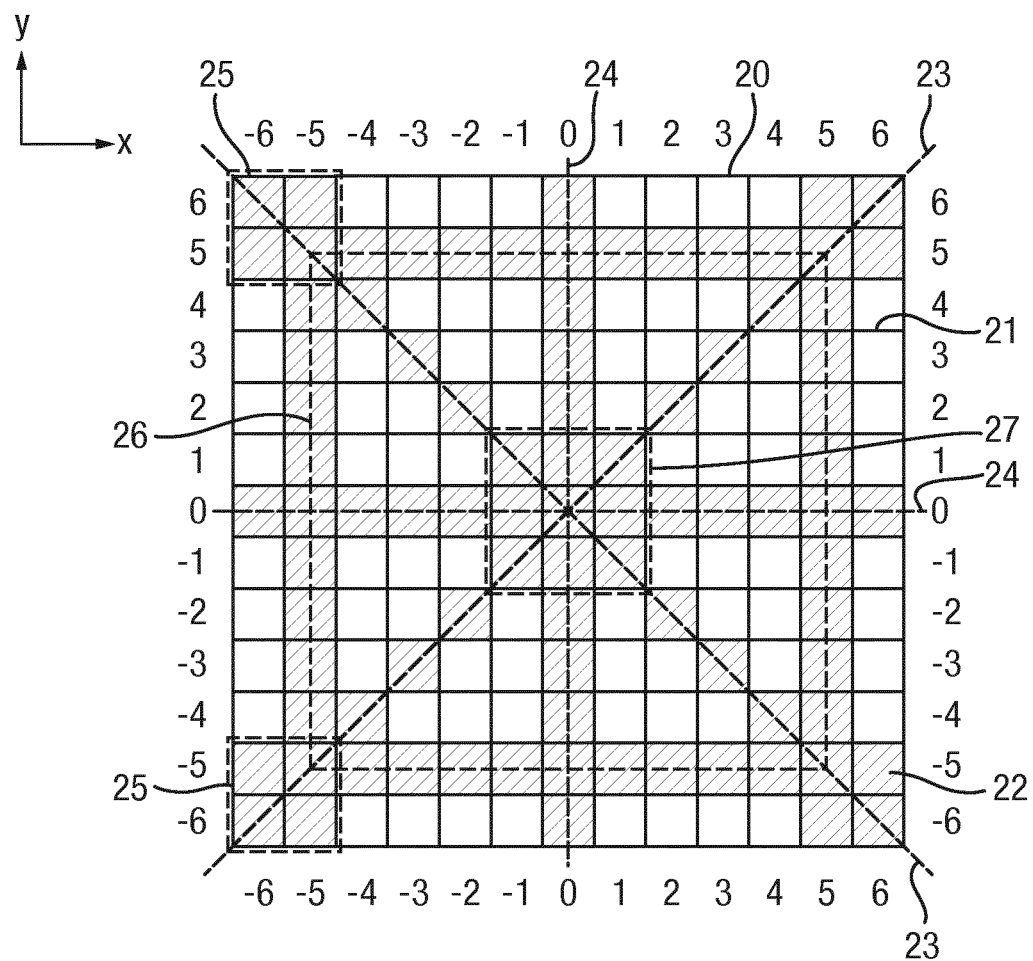

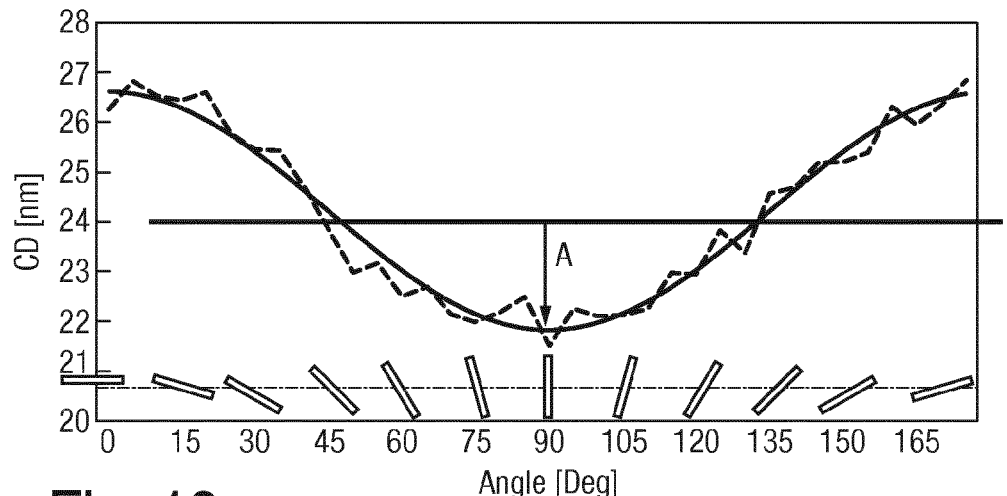
Fig. 10
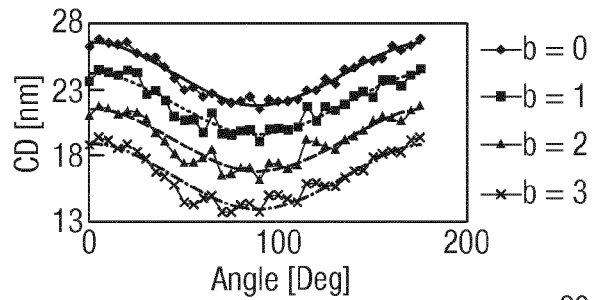
Fig. 11
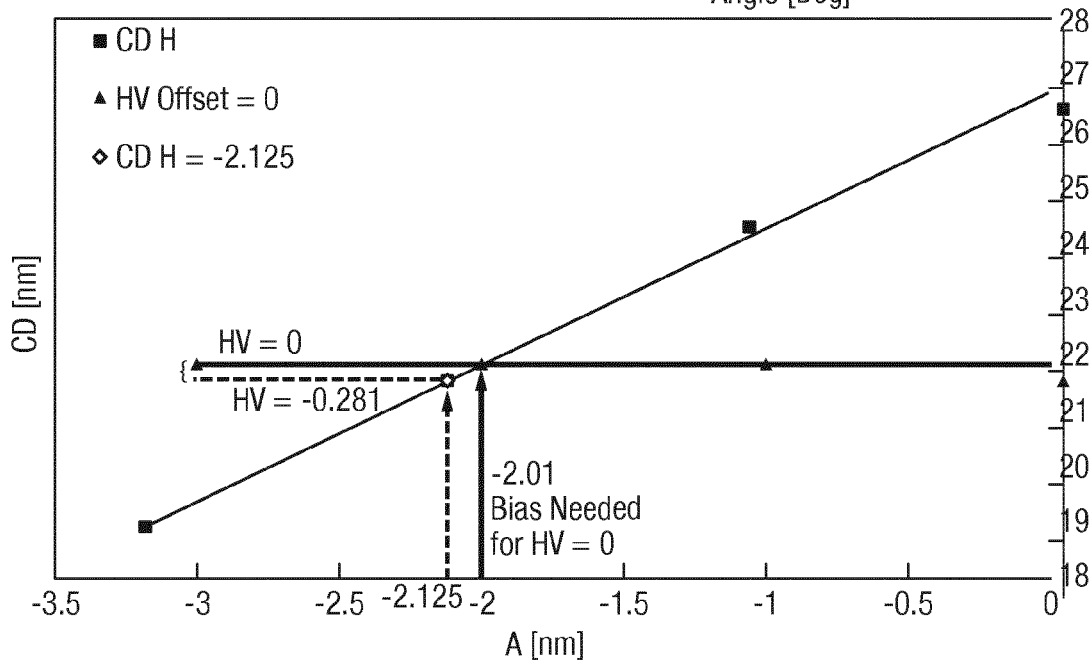

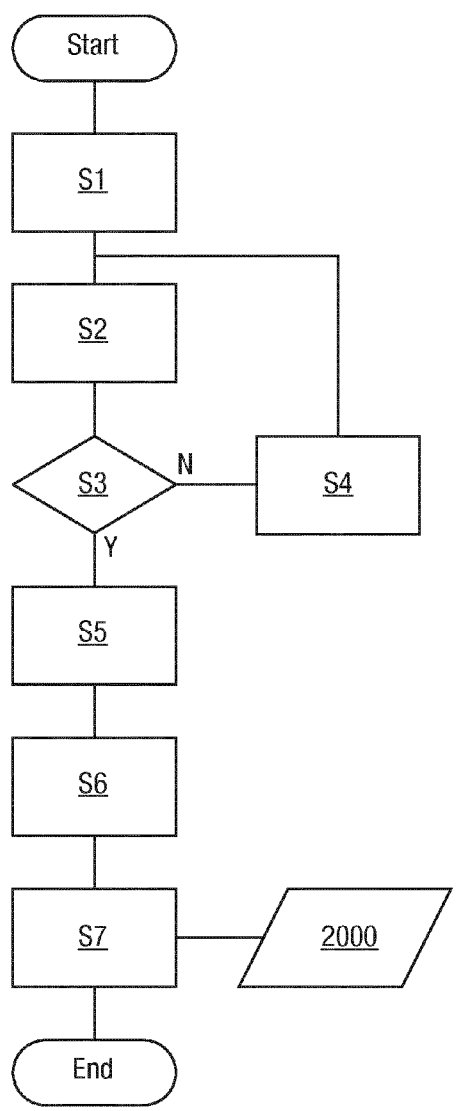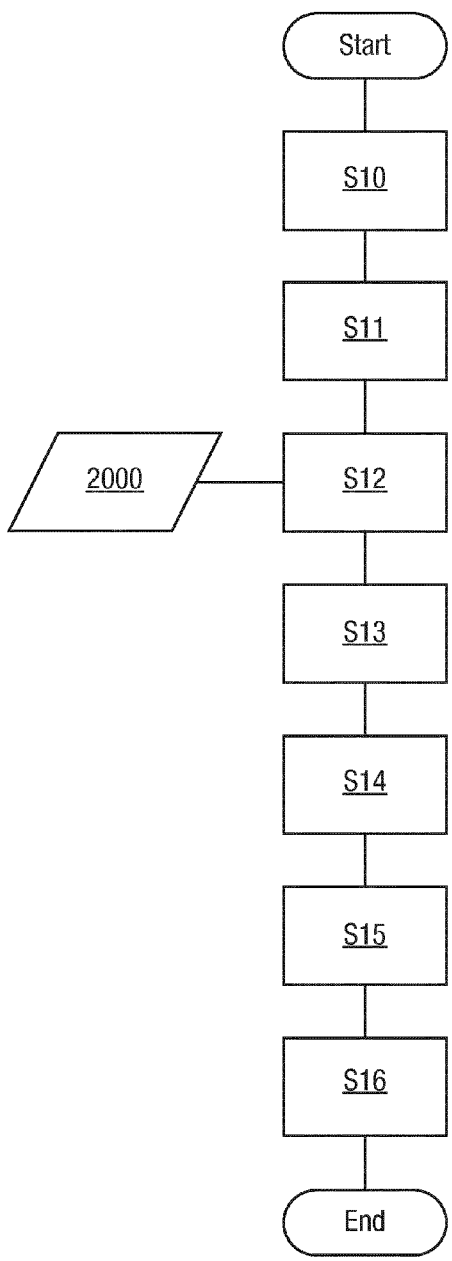

METHOD OF CHARACTERIZING, METHOD OF FORMING A MODEL, METHOD OF SIMULATING, MASK MANUFACTURING METHOD AND DEVICE MANUFACTURING METHOD

CROSS-REFERENCE TO RELATED APPLICATIONS

This application is the U.S. national phase entry of PCT patent application no. PCT/EP2014/072035, which was filed on Oct. 14, 2014, which claims the benefit of priority of EP application no. 13191593, which was filed on Nov. 5, 2013, and which is incorporated herein in its entirety by reference.

FIELD

The present invention relates to a method of characterizing a lithographic apparatus, a method of forming a model of a lithographic apparatus method, a method of simulating a lithographic process, a method of mask manufacture and a device manufacturing method using the mask. In particular, the invention relates to lithographic apparatus using a reflective mask.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to reduce the size of the features of the circuit pattern, it is necessary to reduce the wavelength of the imaging radiation. To this end, lithographic apparatus using EUV radiation, e.g. having a wavelength in the range of from about 5 nm to 20 nm, are under development. EUV radiation is strongly absorbed by almost all materials, therefore the optical systems and mask must be reflective and the apparatus kept under a low pressure or vacuum.

SUMMARY

A reflective mask, such as used in EUV lithography, cannot be illuminated normally (i.e. with light incident perpendicularly to the mask) but must be illuminated with light at an angle to the normal, e.g. about 6°, so that the illumination and projection systems can be positioned adjacent one another. An EUV reflective mask is normally constructed as a multilayer reflector (Distributed Bragg Reflector) with the pattern to be imaged defined by a patterned absorber layer on top of the multilayer reflector. The finite thickness of the absorber layer and the non-normal illumination together cause shadowing effects which alter the dimensions, especially the critical dimension, of the features formed on the substrate from a simple reduction of the mask features. These effects have been found to vary with orientation and position in the image field and/or illumination slit. In other words, a given feature at one orientation and position in the field might be formed with a different dimension than the same feature at a different orientation or different position in the field.

CD variations such as caused by the shadowing effects can be compensated for by adjustments to the mask, e.g. by adding OPC features or biasing the feature widths, and to a certain extent by adjusting illumination settings and/or development parameters. However, to effect such corrections it is necessary to measure or predict the effects to be compensated for. At present, efforts to simulate shadowing effects in EUV masks have not provided sufficiently accurate results.

Therefore, it is desirable to provide a novel approach to measuring and/or predicting shadowing effects, especially those caused by non-normal illumination of reflective masks having thick absorber layers, that can enable more accurate compensation for such effects. According to an aspect of the invention, there is provided a method of characterizing a lithographic mask, the method comprising: providing a mask having thereon an absorber layer having a non-negligible thickness, the absorber layer defining a mask pattern having a plurality of pattern units, each pattern unit comprising a plurality of linear features, the linear features of at least one pattern unit being non-parallel to the linear features of another pattern unit; first exposing a first substrate to an image of the pattern units using the mask pattern in the lithographic apparatus, whilst the mask is positioned in the lithographic apparatus at a first orientation and illuminated by a radiation beam that is incident at an angle to the normal to the mask; second exposing a second substrate to an image of the pattern units using the mask pattern in the lithographic apparatus, whilst the mask is positioned in the lithographic apparatus at a second orientation that is different than the first orientation and illuminated by a radiation beam that is incident at an angle to the normal to the mask; and measuring at least one characteristic of features on the first and second substrates formed in the first and second exposing; and deriving from the measured characteristic a parameter relevant to absorber shadowing;

According to an aspect of the invention, there is provided a method of forming a model of a lithographic exposure process, the method comprising: characterizing a lithographic mask according to the method described above; and using the derived parameter as a parameter of the model.

According to an aspect of the invention, there is provided a mask manufacturing method comprising: simulating a lithographic process using a first mask pattern and a model formed by the method described above to generate a simulated substrate image; analyzing the simulated substrate image to determine pattern corrections that would result in an improved substrate image; and generating a second mask pattern from the first mask pattern and the pattern corrections.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 depicts a calibration mask according to an embodiment of the invention;

FIG. 10 is a graph depicting measured CD values for lines of different orientation;

FIG. 11 is a graph depicting a method of determining a residual Mask HV bias according to an embodiment of the invention;

FIG. 13 depicts steps in a method of calibration according to an embodiment of the invention;

FIG. 14 depicts steps in a method of manufacturing a mask and devices according to an embodiment of the invention.

DETAILED DESCRIPTION

Figure 1:
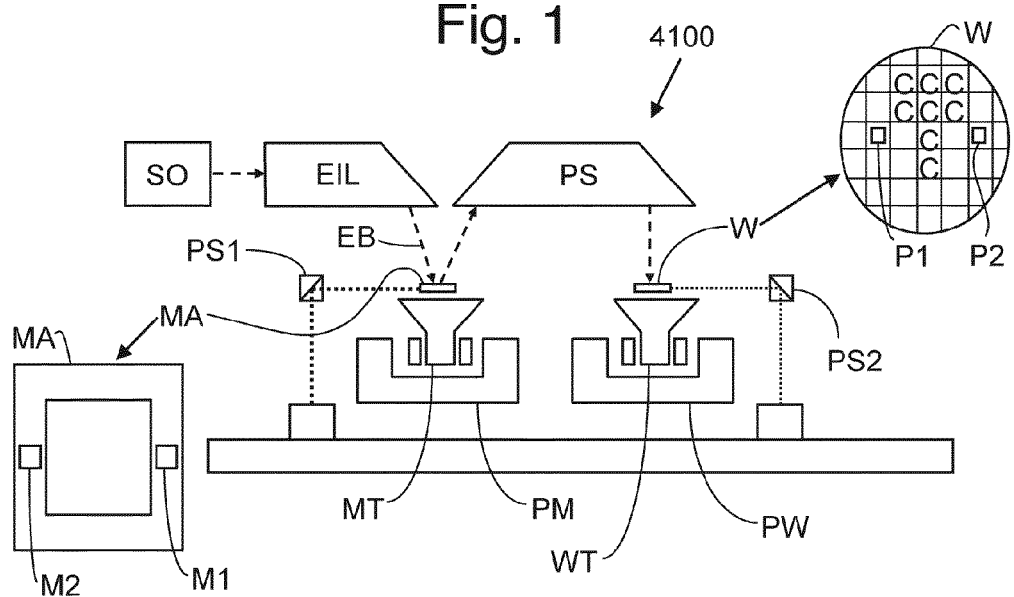
FIG. 1 depicts a lithographic apparatus used in an embodiment of the invention.

FIG. 1 schematically depicts an EUV lithographic apparatus 4100 including a source collector apparatus SO. The apparatus comprises:

an illumination system (illuminator) EIL configured to condition a radiation beam EB (e.g. EUV radiation);

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam EB by patterning device MA onto a target portion C (e.g. comprising one or more dies) of the substrate W.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least a part of one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 1, the EUV illuminator EIL receives an extreme ultraviolet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the desired line-emitting element, with a laser beam. The source collector apparatus SO may be part of an EUV radiation system including a laser, not shown in FIG. 1, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge-produced plasma EUV generator, often termed as a DPP source. Other sources of EUV radiation include a free electron laser and a synchrotron.

The EUV illuminator EIL may comprise an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL may comprise various other components, such as facetted field and pupil mirror devices. The EUV illuminator EIL may be used to condition the radiation beam EB, to have a desired uniformity and intensity distribution in its cross section.

The radiation beam EB is incident on the patterning device (e.g., mask) MA, which is held on the support structure (e.g., mask table) MT, and is patterned by the patterning device. After being reflected from the patterning device (e.g. mask) MA, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) MA with respect to the path of the radiation beam EB. Patterning device (e.g. mask) MA and substrate W may be aligned using mask alignment marks M1, M2 and substrate alignment marks P1, P2.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A control system (not shown) controls the overall operations of the lithographic apparatus and in particular performs an optimization process described further below. The control system can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system may also be configured to control one or more associated process devices and substrate handling devices in a lithocell or cluster of which the lithographic apparatus forms a part. The control system can also be configured to be subordinate to a supervisory control system of a lithocell or cluster and/or an overall control system of a fab.

Figure 2:
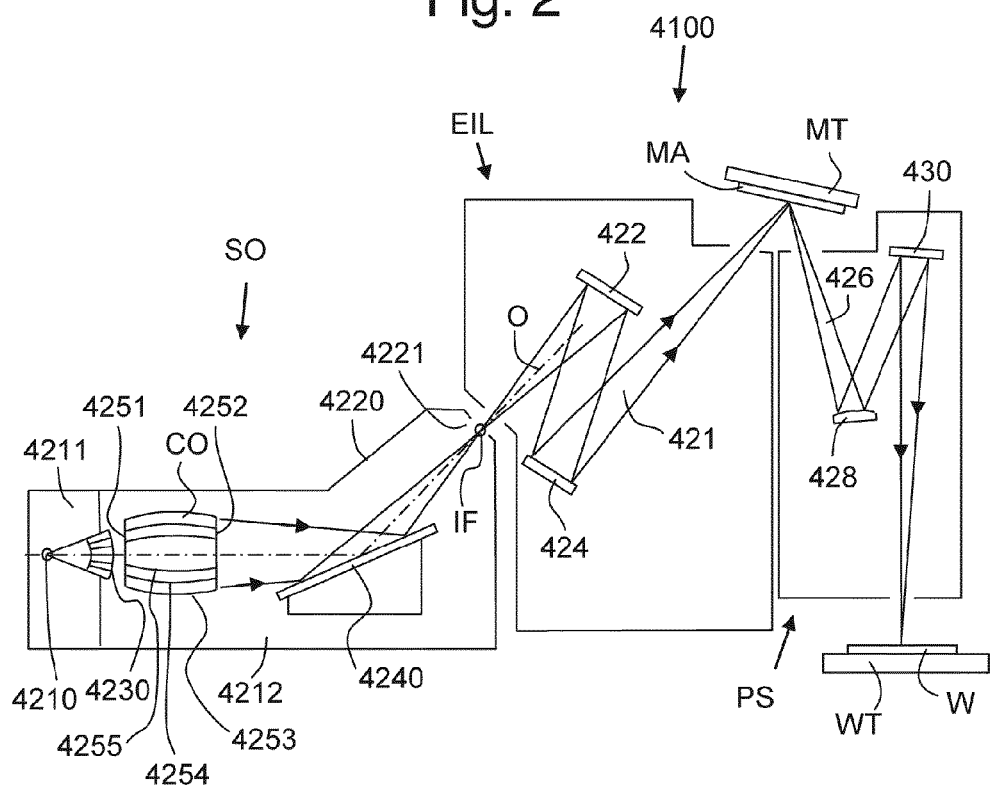
FIG. 2 is a more detailed view of the apparatus of FIG. 1.

FIG. 2 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum. The plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211. The contaminant trap 4230 may include a channel structure. Contamination trap 4230 may also include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate stage or substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be from 1 to 6 additional reflective elements present in the projection system PS than shown in FIG. 2.

Collector optic CO, as illustrated in FIG. 2, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Figure 3:
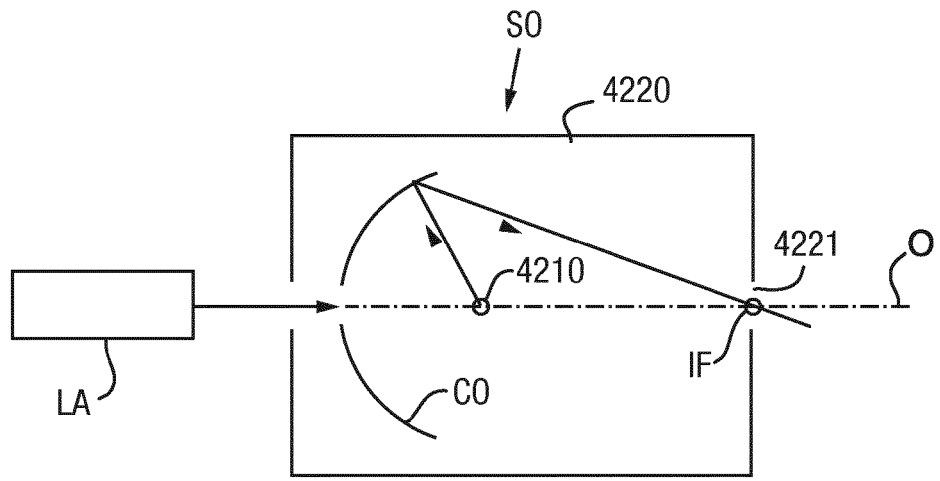
FIG. 3 is a more detailed view of the source collector apparatus of the apparatus of FIGS. 1 and 2.

Alternatively, the source collector apparatus SO may be part of an LPP radiation system as shown in FIG. 3. A laser LA is arranged to deposit laser energy into a fuel, such as xenon (Xe), tin (Sn) or lithium (Li), creating the highly ionized plasma 4210 with electron temperatures of several 10's of eV. The energetic radiation generated during de-excitation and recombination of these ions is emitted from the plasma, collected by a near normal incidence collector optic CO and focused onto the opening 4221 in the enclosing structure 4220.

Figure 4:
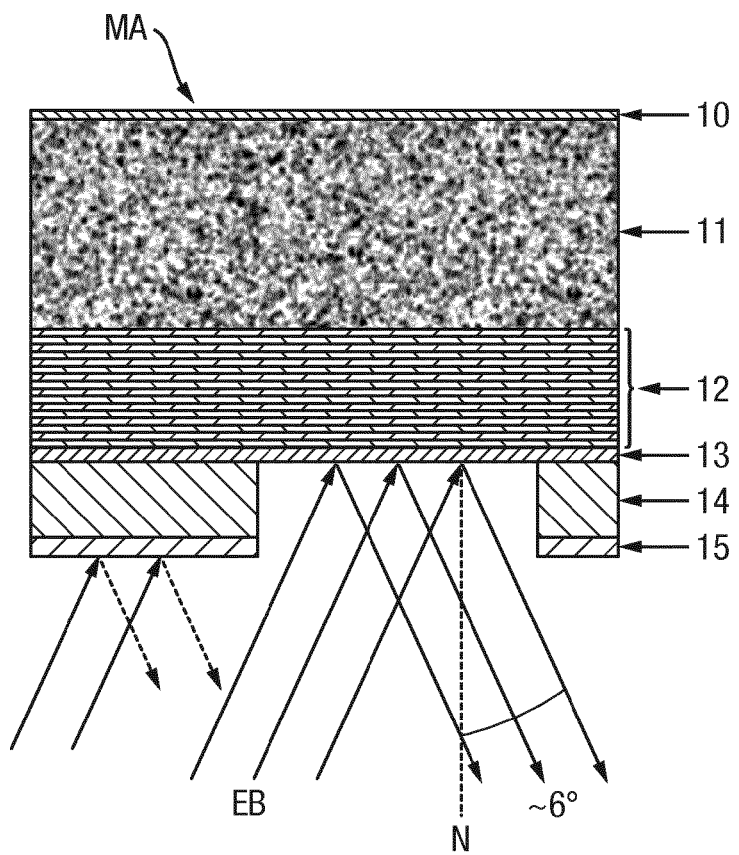
FIG. 4 depicts a part of a multilayer reflective mask.

FIG. 4 is an enlarged cross-sectional view of a part of the mask MA. The mask is built on a substrate 11 of low thermal expansion material such as, for example, Zerodur™ or ULE™. A backside coating 10 is provided on a rear surface of the mask to prevent generation of particulate contaminants. The front surface of the mask comprises a multilayer stack 12 of alternating high refractive index and low refractive index layers so as to form a multilayer reflector, also known as a distributed Bragg reflector. The layers of multilayer reflector 12 are, in an embodiment, formed of Mo and Si. Other layer combinations useful to form multilayer reflectors are known and can be used.

A capping layer 13 is provided on the outer surface of multilayer reflector 12 to protect the multilayer 12, especially from corrosion. The mask pattern is defined by a patterned absorber layer 14 provided on top of capping layer 13. A further absorber layer 15, which also functions as an anti-reflection coating for out of band radiation, e.g. DUV, is optionally also provided. The anti-reflection coating is useful for mask inspection using DUV radiation. The absorber 14 can be made of TaBN, Cr or TaN and the further absorber layer 15 of these modules can be made of TaBO. Other layers, e.g. to promote adhesion, can be present.

The incident radiation beam EB is incident on the mask MA at an angle to the normal, e.g. so that the chief ray is at an angle of about 6° to the normal. The angle of incidence of the chief ray is fixed across the illumination field, but the azimuthal angle varies across the width of the illumination field. The azimuthal angle is the direction, viewed in plan, in which the chief ray inclines and is measured relative to a reference angle. There is a limit to how much the angle of incidence can be reduced because of the physical size of the illumination and projection systems. The effect of non-perpendicular illumination of the mask and the finite (i.e. a non-negligible) thickness of the absorber layers 14 and 15 is a variation of feature dimension of the features imaged on the mask from their nominal value. This variation can be referred to as a shadowing effect.

Figure 5:
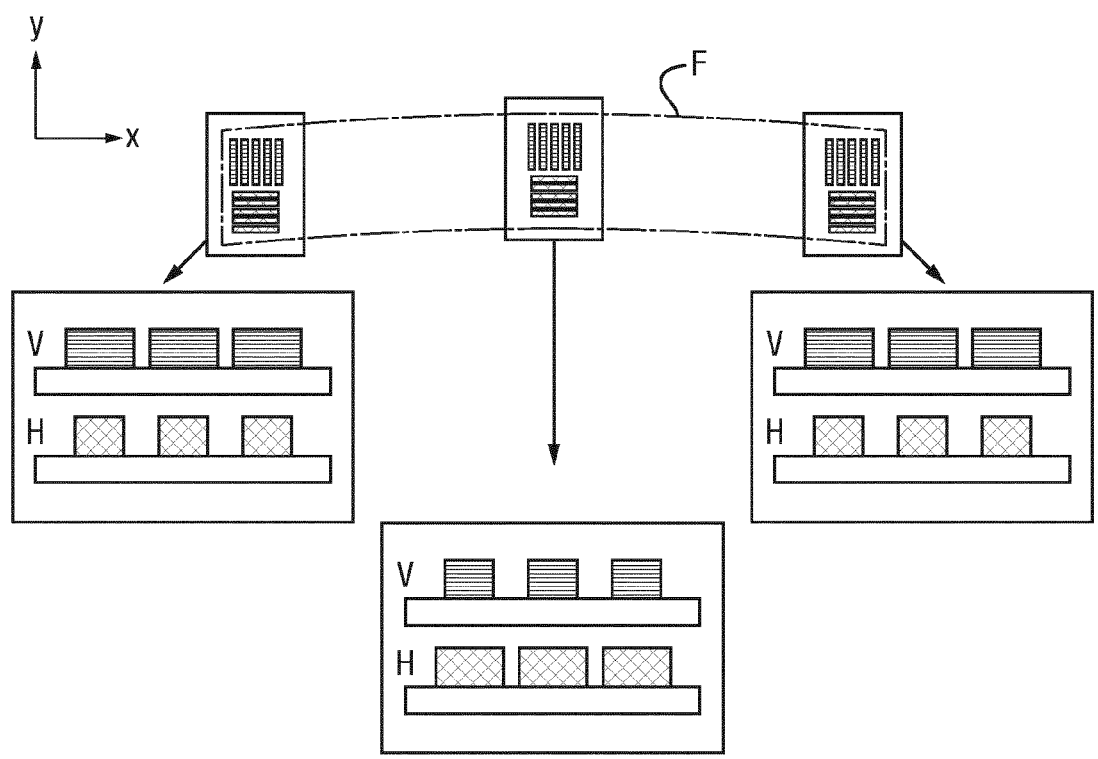
FIG. 5 depicts variation of feature size and HV bias with slit position.

The shadowing effects vary according to the position of features within the illumination field or slit and also differently affect horizontal features, that is features substantially perpendicular to the incident radiation and the scanning direction, and vertical features, that is features substantially parallel to the scanning direction. This is illustrated in FIG. 5 where it can be seen that vertical features of nominally the same width are imaged with greater width at the ends of the illumination field F than in the center. The illumination field F is sometimes referred to as the slit. Horizontal features of nominally the same width are imaged with a narrower width at the edges of the illumination field than in the center. The shadowing effects can therefore be described as causing a variation in HV bias, that is the difference in imaged widths of nominally equal horizontal and vertical features, with slit position.

Shadowing effects can be modeled in simulations of lithographic projection apparatus. However, the present inventors have determined that simulation results from presently available models do not agree well with experimental results. It is presently believed that a possible reason for the failure of simulation results to agree with experiment is that simulations the use of inaccurate values of the refractive index of the absorber layer. It is also believed that another possible reason is that variations in absorber profile, e.g. side wall angle, are not properly considered in current simulations. A common material for the absorber is TaBN. The exact refractive index at EUV wavelengths of TaBN is not accurately known. Available measurements and estimates range from 0.939 to 0.956.

Figure 6:
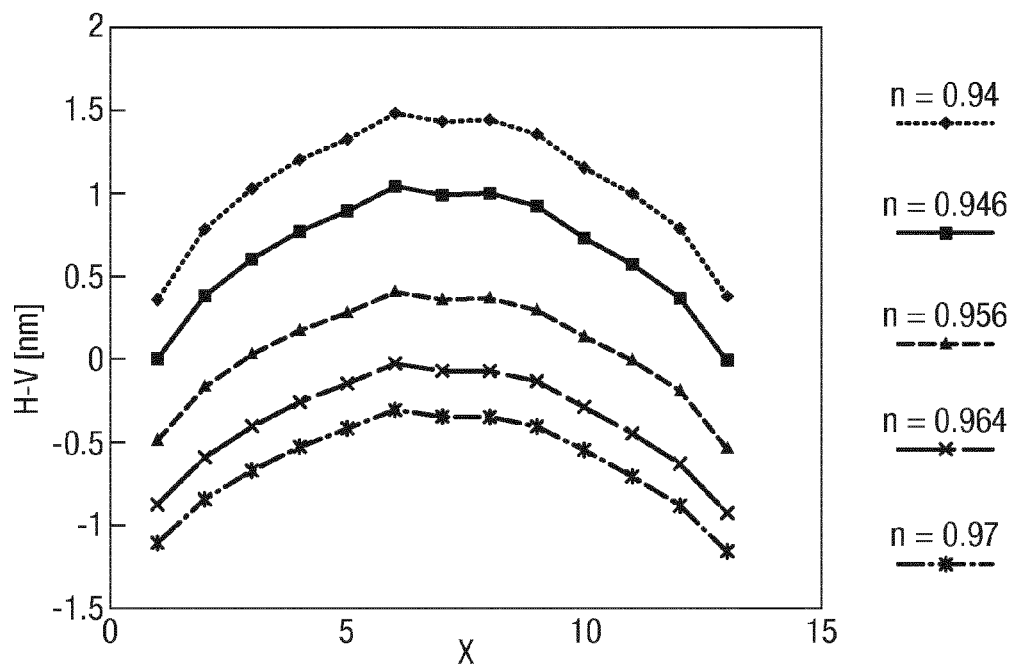
FIG. 6 is a graph showing variation of HV bias with slit position and absorber refractive index.
Figure 7:
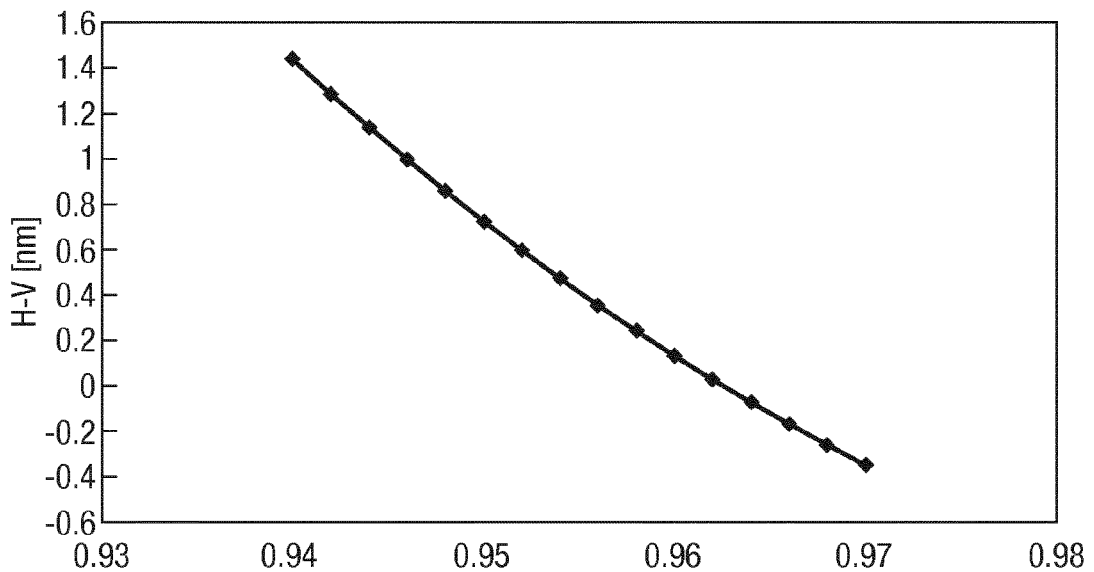
FIG. 7 is a graph showing variation of HV bias with absorber refractive index for one slit position.

FIGS. 6 and 7 represent the results of simulations performed by the inventors to investigate the effect of different values of refractive index of the absorber layer on HV bias. FIG. 6 is a graph showing variation of HV bias across the width of the illumination field IF for various values of the refractive index n ranging from 0.94 to 0.97. The simulations are of 22 nm dense line/space structures with an HV bias of −2 nm and use of a lithographic apparatus with NA=0.33 and conventional illumination. It will be seen that the variation in HV bias, from 0.4 nm at the edges to about 1.5 nm in the middle, is greatest for low values of the refractive index and least, from about −1.1 nm at the edges to about −0.5 nm in the middle, for refractive index n=0.97. FIG. 7 shows variation in the HV bias at the center of the slit with variation in absorber refractive index. It can be seen here that the HV bias is about 1.4 nm at an absorber refractive index of 0.94 and −0.4 nm for a refractive index of 0.97. The variation between is approximately linear.

It is not at present known whether the variation in published estimates of the refractive index of TaBN derives from variations in the measurement technique, variations in the structure or composition of the measured layers or other factors. In particular, the present inventors believe that different methods of creating the absorber layer and/or different methods of patterning it might result in significant variations in the actual refractive index of the absorber layers as well as their profile (especially side wall angle) and hence the shadowing effect.

According to the present invention, a method is provided for fully characterizing the shadowing effects for different positions across the exposure field for different mask types. The resulting information can be used to more accurately model shadowing effects in a simulation of a lithographic exposure process and/or calculate mask corrections to be applied to a pattern that is to be exposed. As a result devices created using a corrected mask can achieve improved CD uniformity and/or higher yield. In some circumstances, it can also be possible to effect improvements through adjustment of imaging parameters such as illumination mode settings.

FIG. 8 schematically depicts a calibration mask pattern 20 according to an embodiment of the invention. As shown, mask pattern 20 is divided into a square grid of cells with rows and columns numbered from −6 to +6, with cell 0, 0 being the center of the mask pattern. The specific number of cells shown is only an example, in embodiments of the invention the mask pattern can be divided into more or fewer cells, e.g. 10×10, 15×20 or 20×20. Alternative numbering schemes than the exemplary one shown can also be employed. It should be noted that the cell boundaries drawn in the Figure need not be evident in a physical embodiment of the mask pattern. Some or all of the cells 21 contain pattern modules 22 each comprising a plurality of pattern units and each pattern unit comprising a plurality of linear features. In an embodiment one cell 21 contains one pattern module 22. The pattern module 22 need not fill the cell. In an embodiment one cell 21 contains multiple pattern modules 22.

In the illustrated embodiment, pattern modules 22 are provided in cells along the diagonals 23. In an embodiment pattern modules are also provided in the shape of a cross 24 positioned along the horizontal and vertical center lines of the mask pattern 20. In an embodiment a group of pattern modules 22, e.g. in the form of a 2×2 square, is provided in each corner 25 of the mask pattern 20. In an embodiment of the invention, pattern modules are provided in the shape of a frame 26 extending around the mask pattern near the periphery thereof, e.g. occupying the cells adjacent to the edge cells. A group 27, e.g. of 3×3 modules, is provided at the center of the mask pattern. Other arrangements of pattern modules can be used. Each of the arrangements described can be used alone or in combination with other arrangements. It is desirable that the arrangement of modules has rotational symmetry, e.g. through rotation of 90° or 180°.

It is desirable that the pattern modules are positioned so as to form a representative sample of the whole area of the illumination field or slit. It is desirable that the arrangement of pattern modules forms a representative sample of a substantial part of the imageable area of the mask. The pattern modules can be arranged so that there are higher numbers of pattern modules in areas of the slit or mask that are expected to experience higher shadowing effects. In an embodiment of the invention every cell of the mask pattern includes a pattern module. In an embodiment of the invention pattern modules are arranged in a checkerboard pattern with alternating filled and empty cells. Cells that are not occupied by pattern modules of the invention can be employed by other test patterns for other calibration processes, alignment markers or other example patterns.

Figure 9A:
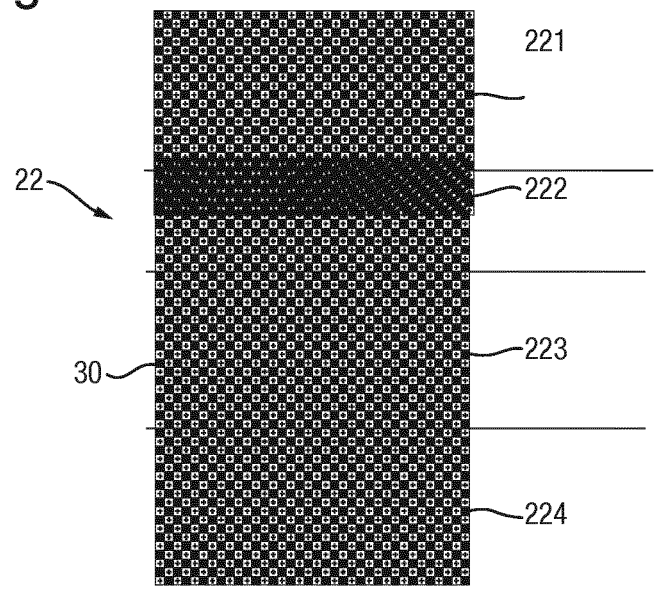
FIGS. 9a to c are enlarged schematic views of a module of the mask of FIG. 8.
Figure 9B:
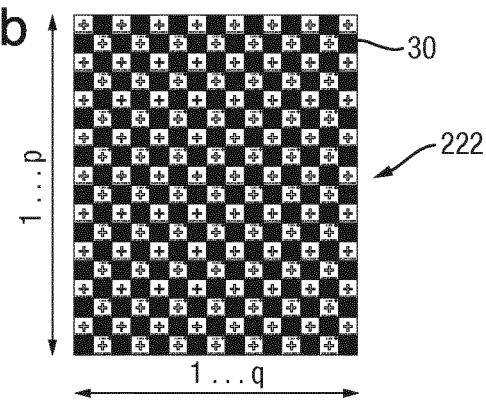
Figure 9C:
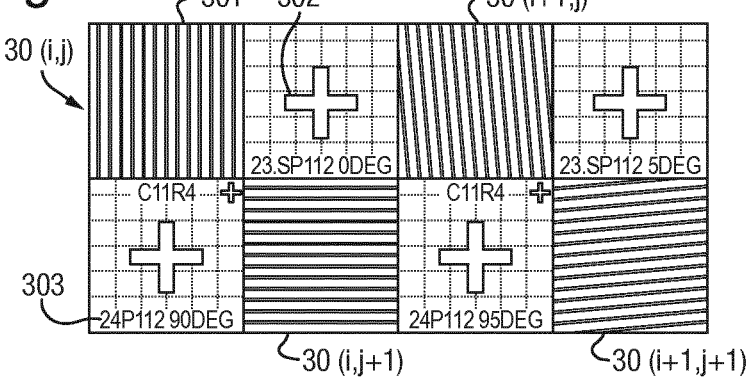

The content of the pattern modules 22 is shown in FIGS. 9A-C. As shown in FIG. 9a the pattern module comprises a plurality of pattern units 30 arranged in a number of sections 221-224. As previously mentioned, each pattern unit 30 comprises a plurality of linear features. Each section contains pattern units having linear features of a particular size and/or dimension. For example, a pattern module might include sections 221-224 respectively containing 22 nm isolated spaces, 16 nm dense lines, 22 nm dense lines and 22 nm isolated lines. Additional or different dimensions and/or feature types can be employed. Desirably, the dimensions and feature types are representative of the features present in a particular pattern that is to be imaged.

As shown in FIG. 9B, each module section, e.g. section 222, comprises an array of pattern units 30 arranged in lines 1 to p and columns 1 to q. In an embodiment p is 9 and q is 18. Only a part of a section is shown in FIG. 9B. Within each section, all pattern units have the same type of elongate feature but along the rows the angle of that feature changes and along the columns the bias, i.e. line space ratio, changes. In an embodiment, angle changes along the columns and bias changes along the rows. Whilst it is desirable to have a plurality of pattern units with different biases, this is not essential. It is also not essential that features with different biases and orientations are arranged in an ordered manner, the arrangement can be random, pseudo random or organized according to a desired scheme.

FIG. 9C is a further enlargement showing four pattern units 30 $(i, j)$ 30 $(i+1, j)$, 30 $(i, j+1)$ and 30 $(i+1, j+1)$. Each pattern unit 30 comprises a region 301 containing a plurality of the elongate features and a reference marker 302. A label 303 identifying the adjacent feature type and orientation can also be provided. In an embodiment, the orientation of the linear features changes by a predetermined step between members of a series of pattern units. Desirably the predetermined step is in the range of from 1° to 10°, preferably from 3° to 7°. In a specific embodiment it is 5°. In an embodiment there are N pattern units in a series with respective different orientations and the predetermined step is substantially equal to $(180/N)$ °. Each such series has linear features of the same type and dimensions. There are multiple series with different feature types and/or dimensions.

The term "linear features" is intended to encompass any feature with a definite orientation of at least one edge that can be varied between pattern units. Features with multiple rotational symmetries, e.g. contact holes, are not suitable. In an embodiment, the linear features are lines. Other suitable features include spaces, brick wall patterns, rectangular slots, chevrons, L-shaped features and U-shaped features. The linear features can be dense, e.g. with a pitch about twice the feature width, sparse or isolated. The linear features can be transparent or dark.

In FIG. 9C pattern unit 30 $(i, j)$ has lines extending at 90° to the reference direction, e.g. the X axis of the mask, whilst pattern unit 30 $(i+1, j)$ has lines extending at 95° to the reference axis. Pattern unit 30 $(i, j+1)$ has lines oriented at 0° to the reference axis and pattern unit 30 $(i+1, j+1)$ has lines oriented at 5° to the reference axis. With pattern units oriented so that the feature areas and marker areas alternate, the illustrated arrangement has diagonally adjacent pattern units having features that are perpendicular to each other.

The mask pattern described above is used in a calibration method according to an embodiment of the present invention which is shown in FIG. 13. In an embodiment of the invention, the calibration method aims to improve the imaging accuracy and/or yield of one or more specific device patterns using a specific mask type. The first step in the characterizing method is to make S1 a calibration mask of the specific mask type and embodying the calibration mask pattern 20. In particular, the calibration mask should be made using an absorber type, thickness and method of manufacture that is substantially the same as is intended to be used for the device patterns to be optimized. Desirably the feature types and sizes in the calibration pattern are selected to be the same as features that are important in the device pattern to be optimized.

The calibration mask is used to expose S2 a wafer to the mask pattern with the mask held in the lithographic apparatus in a first orientation. In the method of the invention, the mask pattern is to be exposed in several different orientations. Therefore, if S3 not all orientations have been done, the mask is removed from the apparatus rotated, re-loaded and exposed again. This process is repeated until all orientations are complete. In an embodiment of the invention, the mask is rotated manually and put in a carrier in the desired orientation. These steps can be carried out in a special mask handling cleanroom. In an embodiment of the present invention the mask is exposed onto substrate at relative orientations of 0°, 90°, 180° and 270°. In each orientation, the mask pattern can be exposed multiple times onto one or more substrates. One substrate can be exposed to the mask in a single orientation. In an embodiment, one substrate is exposed to the mask in more than one orientation, e.g. all four orientations. The use of multiple mask orientations enables any effects of mask errors on the shadowing to be averaged out.

The exposed wafer or wafers are then developed S5 and relevant characteristics measured S6. The characteristics of each imaged pattern unit can be HV bias or other relevant lithographic characteristic such as CD, CD uniformity, line edge roughness, etc. From the measured characteristics, a set of coefficients 2000 for a lithographic model are derived S7.

In an embodiment of the invention, the effect of shadowing on HV bias is modeled using a cosine model:

$$HV = A \cdot \cos(2 \cdot \theta) + B$$

Where $\theta$ is the shadowing angle, i.e. the sum of feature orientation angle plus azimuth angle of the slit position in which the feature was imaged whilst A and B are constant to be determined from the experimental error. A gives the magnitude of the shadowing error variation across the slit whilst B is a constant that determines the residual HV offset dependent shadowing error A and HV bias on the reticle. Derivation of these values is shown in an example in FIGS. 10 and 11.

FIG. 10 illustrates measured critical dimension for a specific slit position as a function of orientation angle of the linear features. In FIG. 10 the dashed line indicates measured data and the solid line the calculated fit, which agrees very well. Coefficient A is given by the amplitude of the fitted curve relative to the average CD value.

In FIG. 11 the main graph plots the CD values of horizontal (angle 0) lines against the HV bias obtained from pattern units of different bias. The smaller graph shows the CD value versus angle plots for those different bias values from which the CDH and rotation bias values are derived. Fitting a line through the CDH-rotation bias values enables determination of a rotation bias value to give an HV bias of 0. From this, a residual HV value of R is derived and B is defined as R−A.

In an embodiment of the invention, the measured characteristics of the substrate or substrates exposed using the calibration mask are used to determine one or more values for optical parameters of the absorber layers 14, 15. In an embodiment, these optical parameters are n (refractive index) and k (extinction coefficient). In an embodiment, values of the optical parameters for the lithography model are determined by increased simulation, e.g. setting trial values, running a simulation, varying the values and repeating the simulation until the simulation results agree with the measured characteristics to within acceptable limits A cost metric can be defined to measure agreement of the simulated and experimental results. These values for the optical parameters can then be used in a lithography model to more accurately simulate exposures using masks of the relevant type and to derive more accurate values for lithographic metrics such as HV bias, CD, best focus, etc.

In an embodiment of the invention, the measured characteristics of the substrate or substrates exposed using the calibration mask are used to determine one or more values for parameters of the profile of the absorber layers 14, 15. In an embodiment, these profile parameters are side wall angle and/or absorber thickness. These values for the profile parameters can then be used in a lithography model to more accurately simulate exposures using masks of the relevant type and to derive more accurate values for lithographic metrics such as HV bias, CD, best focus, etc.

In an embodiment of the invention the measured characteristics of the substrate or substrates exposed using the calibration mask are used to determine one or more values for both optical parameters and profile parameters of the absorber.

A device manufacturing method according to the invention is disclosed in FIG. 14. Initially, a device pattern is obtained S10 or created. A suitable mask type for printing the device pattern is selected S11. Calibration coefficients 2000 appropriate to the selected mask type are imported S12 to simulation software or optical proximity correction software that automatically adjusts features as desired. The optical proximity correction is performed S13. This step may involve repeated simulation of the imaging process and adjustment of the pattern or application of adjustments to the pattern on the basis of predetermined rules. In the case of repeated simulation, the coefficients 2000 are used to improve accuracy of the model. In the case of rules-based OPC, the coefficients 2000 are used in parameters of the rules to control application thereof. A rules-based approach to optical proximity correction for shadowing effects can be combined with rules-based corrections for other effects. It is desirable that a simulation-based approach to OPC simultaneously takes account of all imaging conditions that might affect the final image. However, it is possible to combine simulation-based OPC and rules-based OPC. For example, rules-based OPC may be performed first to provide an initial pattern which has final improvements made through simulation and adjustment.

In an embodiment of the invention, a correction is applied to a dimension, e.g. width, of features that depends on the angle of the features relative to a reference angle. Such an angle-dependent correction can be a HV bias and/or a correction applied to features at other specific angles.

Once the pattern to be imaged has been established, a mask of the relevant type embodying the pattern to be imaged is manufactured S14.

The mask is used to expose S15 substrates to the desired pattern. The exposed substrates are developed and processed S16 as required to form the desired pattern layer. These steps are repeated as necessary to build up the complete device pattern. Once all pattern layers have been completed, the substrates are diced and packaged as required. Commonly, not all device layers are critical. Non-critical device layers can be formed using non-EUV lithographic apparatus and/or without taking account of shadowing effects.

Figure 12:
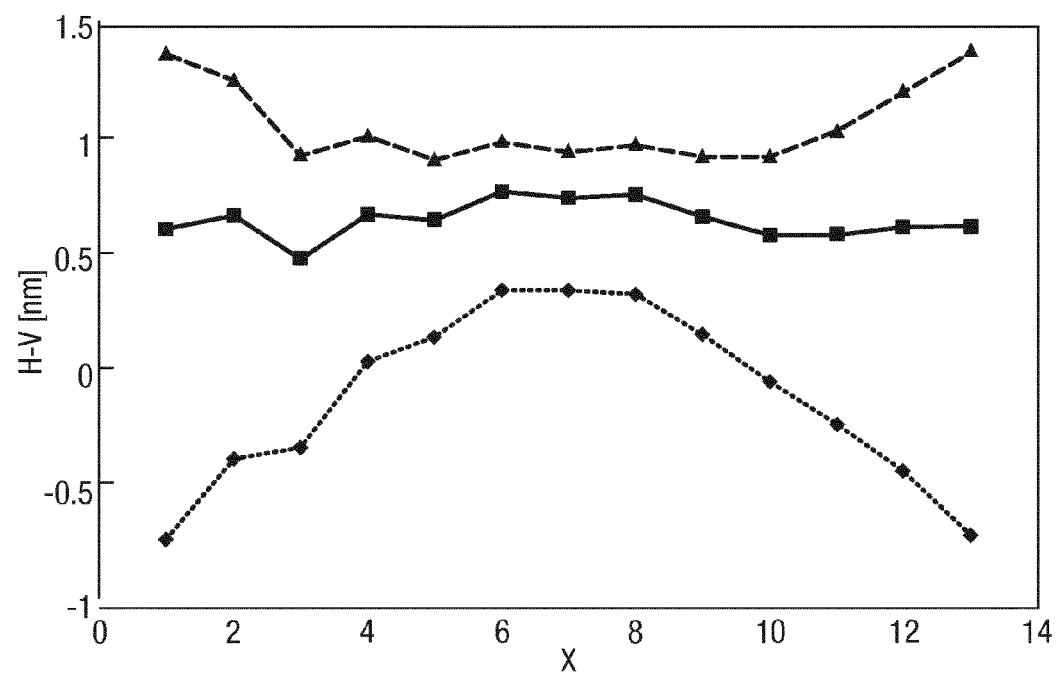
FIG. 12 is a graph comparing HV corrections according to a method of the invention and a simulation approach.

FIG. 12 depicts the result of experiments in correcting for shadowing effects using the method of the invention. The graph shows HV bias versus position across the width of the illumination field or slit (the X direction) for three cases. The dotted line with diamond data points shows a measured shadowing effect, with HV bias varying from about −0.7 nm at the slit edges to about +0.4 nm at the slit center. The dashed line with triangular data points shows corrections based on simulations using an assumed refractive index for the absorber. There is an improvement over the measured bias but still considerable variation. The HV bias is about 1.4 nm at slit edges and about 1.0 nm at the slit center. The simulated corrections appear to overcompensate at the slit edges. The solid line with square data points shows correction based on a method according to an embodiment of the present invention. The HV bias is much more uniform between about 0.5 and 0.7 nm across the slit width.

Figure 15:
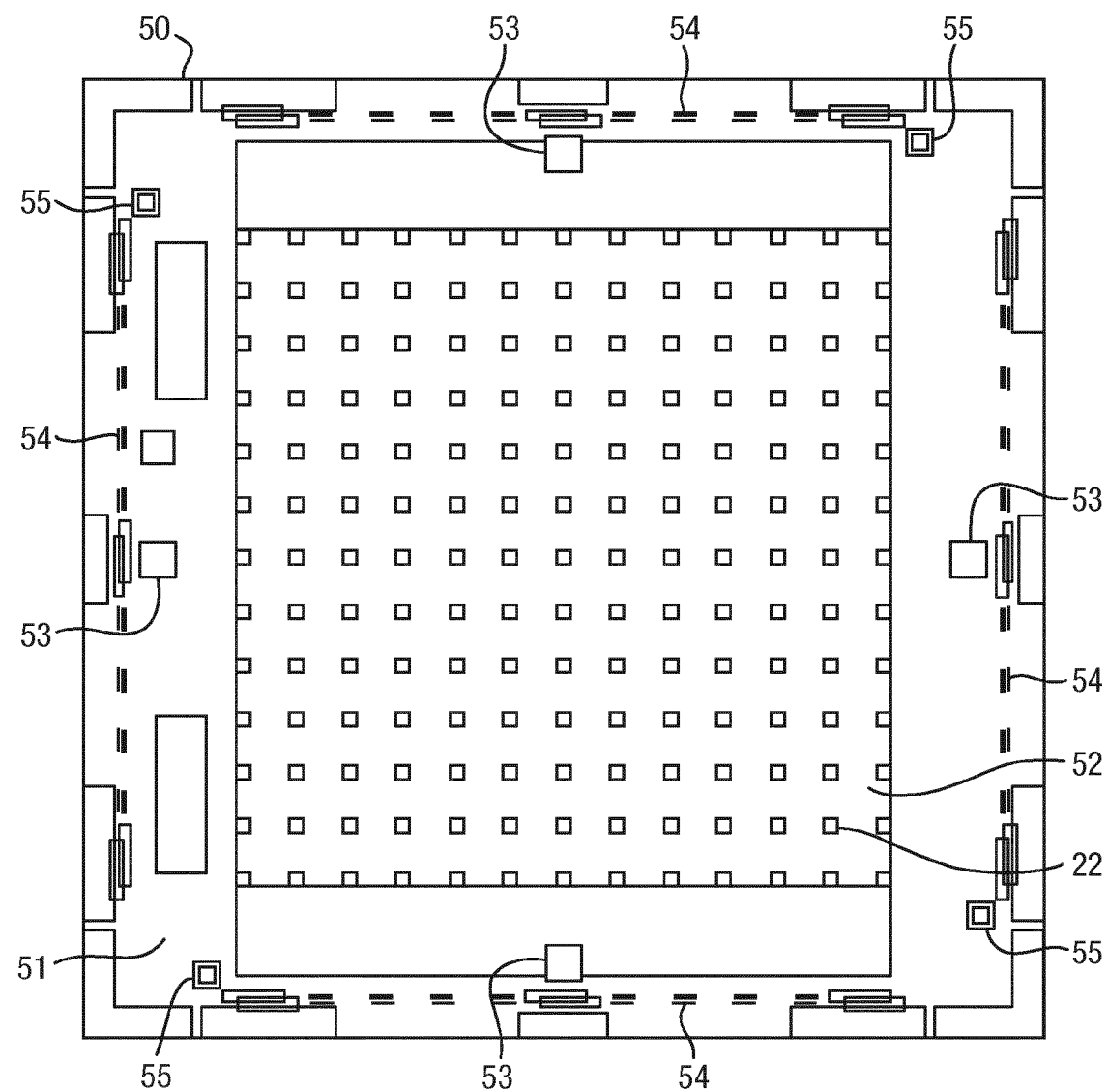
FIG. 15 depicts a calibration mask according to an embodiment of the invention.

FIG. 15 depicts a calibration mask 50 usable in embodiments of the present invention. Mask 50 comprises a frame 51 and a pattern area 52. Frame 51 is physically conventional but, as described further below, includes additional indicia and marks for use in methods according to the present invention. Pattern area 52 comprises a conventional substrate, multilayer reflector and patterned absorber. A conventional pattern area is rectangular corresponding to the rectangular object field of a lithographic apparatus. In the case of mask 50 according to the present invention, the imaging area 52 is substantially square. To create a square imaging area, the not required parts of the standard imaging area may be omitted or masked out.

A conventional mask for use in lithography carries a machine-readable index, e.g. a two-dimensional barcode, that can be read by the lithographic apparatus in order to identify the mask. This machine-readable index is located at a standardized position on the mask. Mask 50 according to the present invention is provided with multiple machine-readable indicia 55 corresponding to the number of orientations it is to be used in. Each of the machine-readable indicia 55 is located in a position that corresponds to the standard position for the machine-readable index when the mask is loaded into the lithographic apparatus in a respective one of the intended orientations.

A conventional mask also includes a number of alignment markers 53, 54 in predetermined positions that are used for pre-alignment and then main alignment to detect accurately the position of the mask within the apparatus. Mask 50 has a plurality of sets of alignment markers 53, 54 located in positions on the frame such that they are in the expected predetermined positions when the mask is loaded into the lithographic apparatus in the different possible orientations.

In an embodiment of the invention a circular mask is used. A circular mask can be made lithographically and processed using available process equipment. The circular mask carries pattern units of linear features as desired above. However, the pattern units can have fewer different orientations of the linear features with a full range of orientations being achieved by rotation of the circular mask by small angles.

As will be appreciated, any of the above described features can be used with any other feature and it is not only those combinations explicitly described which are covered in this application. Although the invention has been described with reference to reflective masks and EUV radiation, it will be appreciated that the invention can also be used with transparent masks and/or other forms of radiation such as DUV.

A method according to an embodiment of the invention can also be used for diagnostic and calibration purposes, e.g. to detect and/or measure alignment errors in the illumination and/or projection systems.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. In the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g., diameter) of 300 mm or 450 mm or any other size.

The invention may further be described using the following clauses:

1. A method of characterizing a lithographic mask, the method comprising:
providing a mask having thereon an absorber layer having a non-negligible thickness, the absorber layer defining a mask pattern having a plurality of pattern units, each pattern unit comprising a plurality of linear features, the linear features of at least one pattern unit being non-parallel to the linear features of another pattern unit;

first exposing a first substrate to an image of the pattern units using the mask pattern in the lithographic apparatus, whilst the mask is positioned in the lithographic apparatus at a first orientation and illuminated by a radiation beam that is incident at an angle to the normal to the mask;

second exposing a second substrate to an image of the pattern units using the mask pattern in the lithographic apparatus, whilst the mask is positioned in the lithographic apparatus at a second orientation that is different than the first orientation and illuminated by a radiation beam that is incident at an angle to the normal to the mask; and measuring at least one characteristic of features on the first and second substrates formed in the first and second exposing; and deriving from the measured characteristic a parameter relevant to absorber shadowing.

2. A method according clause 1 wherein deriving comprises determining a coefficient of a shadowing curve reflecting bias of features at a specific orientation, e.g. HV bias, to shadowing angle, the shadowing angle being the sum of feature orientation angle and azimuth angle of the radiation beam at the position of the feature.

3. A method according to clause 2 wherein the shadowing curve has the form $A \cdot \cos(2 \cdot \theta) + B$, where $\theta$ is the sum of a feature angle and azimuthal angle of the radiation beam at the position of the feature and A and B are constant parameters derived from the measured characteristic.

4. A method according to clause 1, 2 or 3 wherein deriving comprises deriving a parameter of the absorber selected from the group consisting of optical parameters, such as refractive index and extinction coefficient, and profile parameters, such as side wall angle and thickness.

5. A method according to clause 4 wherein the parameter of the absorber is derived by an interactive process of simulating exposures and comprising results to the measured characteristics.

6. A method according to any one of the preceding clauses wherein the angle between the first and second orientations is substantially equal to 90, 180 or 270 degrees.

7. A method according to any one of the preceding clauses wherein the mask is reflective.

8. A method according to clause 7 wherein the radiation beam comprises EUV radiation.

9. A method according to any one of the preceding clauses wherein the plurality of pattern units include a first pattern unit having linear features extending in a first direction and a second pattern unit having linear features extending in a second direction, wherein the angle between the first direction and the second direction is in the range of from 1 to 10 degrees, preferably from 3 to 7 degrees.

10. A method according to any one of the preceding clauses wherein the plurality of pattern units includes N pattern units having linear features extending in respective directions such that the nth pattern unit has linear features extending in an nth direction, the nth direction being at an angle of $n \cdot (180/N)$ to a reference direction, N being an integer greater than 4 and n being an integer ranging from 1 to N.

11. A method according to clause 10 wherein N is in the range of from 10 to 180.

12. A method according to any one of the preceding clauses wherein the linear features have a feature type selected from the group consisting of: lines, spaces, dense lines, isolated lines, and isolated spaces.

13. A method according to any one of the preceding clauses wherein the plurality of pattern units include at least two pattern units comprising features of different feature types.

14. A method according to any one of the preceding clauses wherein the plurality of pattern units include at least two pattern units comprising features of different dimensions.

15. A method according to clause 14 wherein the dimensions are selected from the group consisting of: line width, pitch, space width and bias.

16. A method according to any one of the preceding clauses wherein the mask pattern comprises a plurality of pattern modules, each pattern module comprising a plurality of the pattern units, wherein the linear features of at least one pattern unit of each module are non-parallel to the linear features of another pattern unit of the same module.

17. A method according to clause 16 wherein the arrangement of pattern modules is substantially symmetric through rotation by 90 or 180 degrees.

18. A method according to anyone of the preceding clauses wherein the first substrate and the second substrate are the same substrate.

19. A method of forming a model of a lithographic exposure process, the method comprising:

characterizing a lithographic mask according to the method of any one of clauses 1 to 18; and using the derived parameter as a parameter of the model.

20. A method of simulating a lithographic process wherein a model formed by the method of any one of clauses 15 to 18 is used.

21. A mask manufacturing method comprising:

simulating a lithographic process using a first mask pattern and a model formed by the method of clause 19 to generate a simulated substrate image;

analyzing the simulated substrate image to determine pattern corrections that would result in an improved substrate image; and generating a second mask pattern from the first mask pattern and the pattern corrections.

22. A mask manufacturing method according to clause 21 wherein the pattern correction is a correction of a dimension of features dependent on their orientation, e.g. an HV bias.

23. A device manufacturing method comprising:

manufacturing a mask according to the method of clause 21 or 22; and exposing a substrate using the mask.

The descriptions above are intended to be illustrative, not limiting. Thus, it will be apparent to one skilled in the art that modifications may be made to the invention as described without departing from the scope of the claims set out below.

The invention claimed is:

1. A method comprising:

providing a lithographic mask having thereon an absorber layer having a non-negligible thickness, the absorber layer defining a mask pattern having a plurality of pattern units, each pattern unit comprising a plurality of linear features, the linear features of at least one pattern unit being non-parallel to the linear features of another pattern unit;

first exposing a first substrate to an image of the pattern units using the mask pattern in the lithographic apparatus, whilst the mask is positioned in the lithographic apparatus at a first orientation and illuminated by a radiation beam that is incident at an angle to the normal to the mask;

second exposing a second substrate to an image of the pattern units using the mask pattern in the lithographic apparatus, whilst the mask is positioned in the lithographic apparatus at a second orientation that is different than the first orientation and illuminated by a radiation beam that is incident at an angle to the normal to the mask;

measuring at least one characteristic of features on the first and second substrates formed in the first and second exposing; and deriving from the measured characteristic a parameter relevant to absorber shadowing.

2. A method according claim 1, wherein the deriving comprises determining a coefficient of a shadowing curve reflecting bias of features at a specific orientation to shadowing angle, the shadowing angle being the sum of feature orientation angle and azimuth angle of the radiation beam at the position of the feature.

3. A method according to claim 2, wherein the shadowing curve has the form $A \cdot \cos(2 \cdot \theta) + B$, where $\theta$ is the sum of a feature orientation angle and azimuthal angle of the radiation beam at the position of the feature and A and B are constant parameters derived from the measured characteristic.

4. A method according to claim 1, wherein the deriving comprises deriving a parameter of the absorber selected from the group consisting of an optical parameter, and a profile parameter.

5. A method according to claim 1, wherein the mask is reflective.

6. A method according to claim 1, wherein the plurality of pattern units include a first pattern unit having linear features extending in a first direction and a second pattern unit having linear features extending in a second direction, wherein the angle between the first direction and the second direction is in the range of from 1 to 10 degrees.

7. A method according to claim 1, wherein the plurality of pattern units includes N pattern units having linear features extending in respective directions such that the nth pattern unit has linear features extending in an nth direction, the nth direction being at an angle of $n \cdot (180/N)$ to a reference direction, N being an integer greater than 4 and n being an integer ranging from 1 to N.

8. A method according to claim 1, wherein the linear features have a feature type selected from the group consisting of: lines, spaces, dense lines, isolated lines, and isolated spaces.

9. A method according to claim 1, wherein the plurality of pattern units include at least two pattern units comprising features of different dimension.

10. A method according to claim 9 wherein the dimension is selected from the group consisting of: line width, pitch, space width and bias.

11. A method according to claim 1, wherein the mask pattern comprises a plurality of pattern modules, each pattern module comprising a plurality of the pattern units, wherein the linear features of at least one pattern unit of each module are non-parallel to the linear features of another pattern unit of the same module.

12. A method of forming a model of a lithographic exposure process, the method comprising:

characterizing the lithographic mask according to the method of claim 1; and using the derived parameter as a parameter of the model.

13. A method comprising simulating a lithographic process using the model formed by the method of claim 12.

14. A mask manufacturing method comprising:

simulating a lithographic process using a first mask pattern and a model formed by the method of claim 12 to generate a simulated substrate image;

analyzing the simulated substrate image to determine pattern corrections for improving a substrate image; and generating a second mask pattern from the first mask pattern and the pattern corrections.

15. A device manufacturing method comprising:

manufacturing a mask according to the method of claim 14; and exposing a substrate using the mask.

16. A method according to claim 1, wherein the angle between the first and second orientations is substantially equal to 90, 180 or 270 degrees.

17. A method according to claim 1, wherein the plurality of pattern units include at least two pattern units comprising features of different feature types.

18. A method according to claim 1, wherein the radiation beam comprises EUV radiation.

19. A method according to claim 4, wherein the parameter of the absorber is derived by an interactive process of simulating exposures and comparing such results to the measured at least one characteristic.

20. A method according to claim 7, wherein N is in the range of from 10 to 180.

* * * * *